(12) United States Patent
Hsu et al.

(10) Patent No.: US 8,110,747 B2
(45) Date of Patent: Feb. 7, 2012

(54) FLEXIBLE PRINTED CIRCUIT BOARD

(75) Inventors: Shou-Kuo Hsu, Taipei Hsien (TW); Chia-Nan Pai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 389 days.

(21) Appl. No.: 12/430,133

(22) Filed: Apr. 27, 2009

(65) Prior Publication Data

US 2010/0258337 A1 Oct. 14, 2010

(30) Foreign Application Priority Data

Apr. 13, 2009 (CN) .......................... 2009 1 0301499

(51) Int. Cl.
*H05K 1/00* (2006.01)
(52) U.S. Cl. ........................ 174/254; 174/261
(58) Field of Classification Search .................. 174/254, 174/255, 261, 27, 36, 113 R; 361/777, 780, 361/794–796; 333/4, 5, 33, 238, 246; 257/662, 257/664, 698, 758; 29/847
See application file for complete search history.

(56) References Cited

U.S. PATENT DOCUMENTS

| | | | | |
|---|---|---|---|---|
| 4,680,557 A | * | 7/1987 | Compton | 333/1 |
| 5,539,360 A | * | 7/1996 | Vannatta et al. | 333/4 |
| 6,384,341 B1 | * | 5/2002 | Rothermel et al. | 174/255 |
| 2003/0047347 A1 | * | 3/2003 | Lin et al. | 174/113 R |
| 2006/0061432 A1 | * | 3/2006 | Hsu et al. | 333/33 |
| 2009/0260859 A1 | * | 10/2009 | Pai et al. | 174/254 |

FOREIGN PATENT DOCUMENTS

JP 2007150000 * 6/2007

* cited by examiner

*Primary Examiner* — Yuriy Semenenko
(74) *Attorney, Agent, or Firm* — Altis Law Group, Inc.

(57) ABSTRACT

A flexible printed circuit board (FPCB) includes a signal layer, upper and lower ground layers, and two dielectric layers. The signal layer includes a differential pair comprising two transmission lines to transmit a pair of differential signals. The dielectric layers are located on and under the signal layer to sandwich the signal layer. The upper ground layer is attached to the dielectric layer on the signal layer, opposite to the signal layer. The lower ground layer is attached to the dielectric layer under the signal layer, opposite to the signal layer. Each ground layer includes a grounded sheet made of conductive material. Two voids are defined in each ground layer and located at opposite sides of the corresponding grounded sheet. Distances between the middle line of the grounded sheet of each ground layer and middle lines of the two transmission lines are equal.

13 Claims, 2 Drawing Sheets

FLEXIBLE PRINTED CIRCUIT BOARD

CROSS-REFERENCES TO RELATED APPLICATION

Relevant subject matter is disclosed in co-pending U.S. patent applications entitled "FLEXIBLE PRINTED CIRCUIT BOARD" respectively filed on Nov. 29, 2007 with application Ser. No. 11/946,859, filed on Dec. 5, 2007 with application Ser. No. 11/951,290, filed on Jun. 3, 2008 with application Ser. No. 12/132,067, and filed on Sep. 15, 2008 with application Ser. No. 12/211,057, and assigned to the same assignee as that of the present application.

BACKGROUND

1. Technical Field

The present disclosure relates to flexible printed circuit boards (FPCBs) and, particularly, to an FPCB for transmitting high speed signals.

2. Description of Related Art

FPCBs are light, soft, thin, small, ductile, flexible, and supporting high wiring density. FPCBs can be three-dimensionally wired and shaped according to space limitations. Flexible circuits are generally useful for electronic packages where flexibility, weight control and the like are important.

Referring to FIG. 1, a related-art FPCB includes a signal layer and a ground layer 50. A differential pair 51 consisting of two transmission lines 52 and 54 is arranged in the signal layer. The ground layer 50 is beneath the signal layer and etched in a grid array. The layout in the ground layer 50 beneath the transmission line 52 is different from that beneath the transmission line 54, noise is easily generated, which prevents the FPCB from transmitting high speed signals.

DETAILED DESCRIPTION

Figure 1:
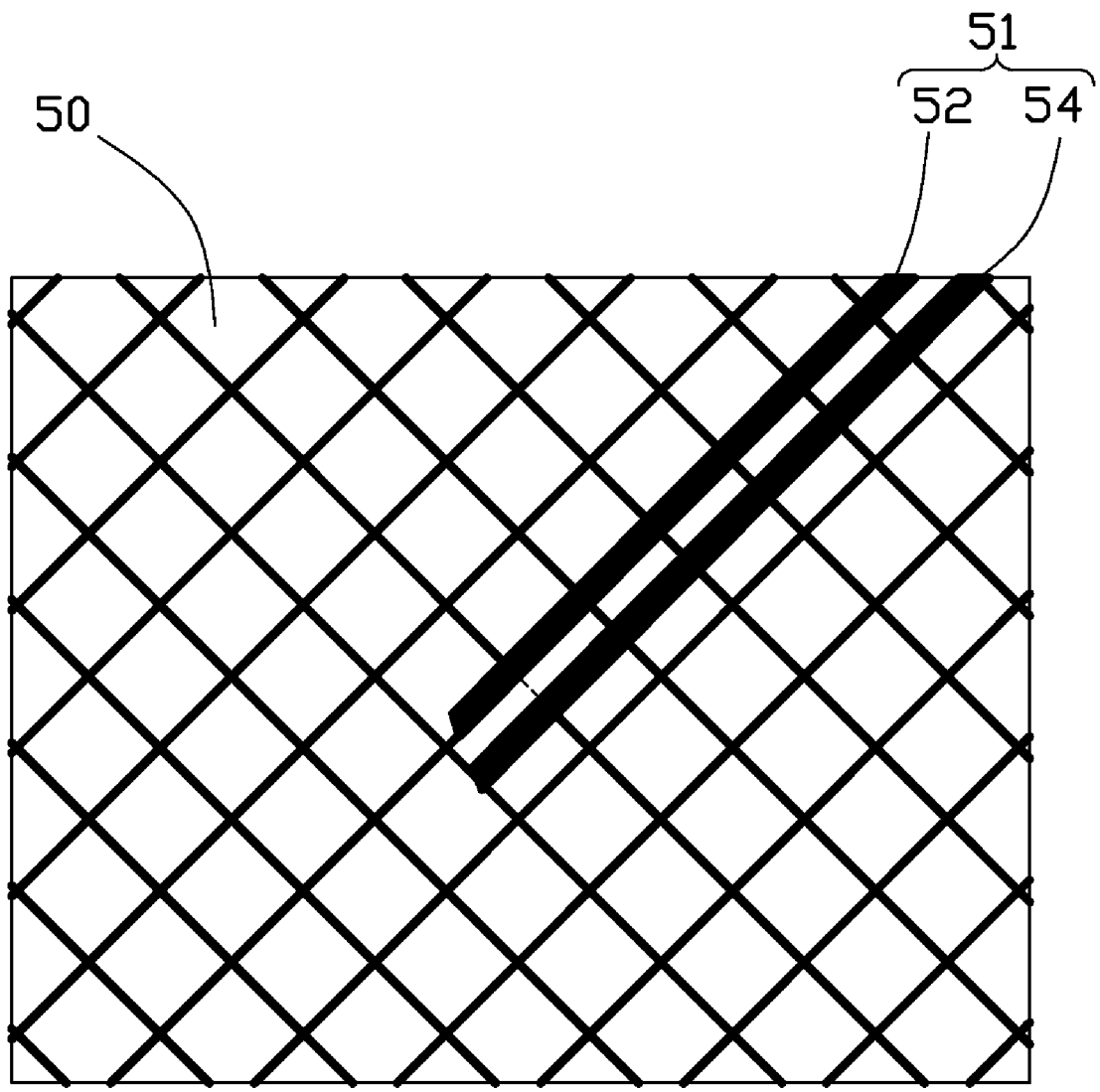
FIG. 1 is a schematic diagram of a related-art FPCB.
Figure 2:
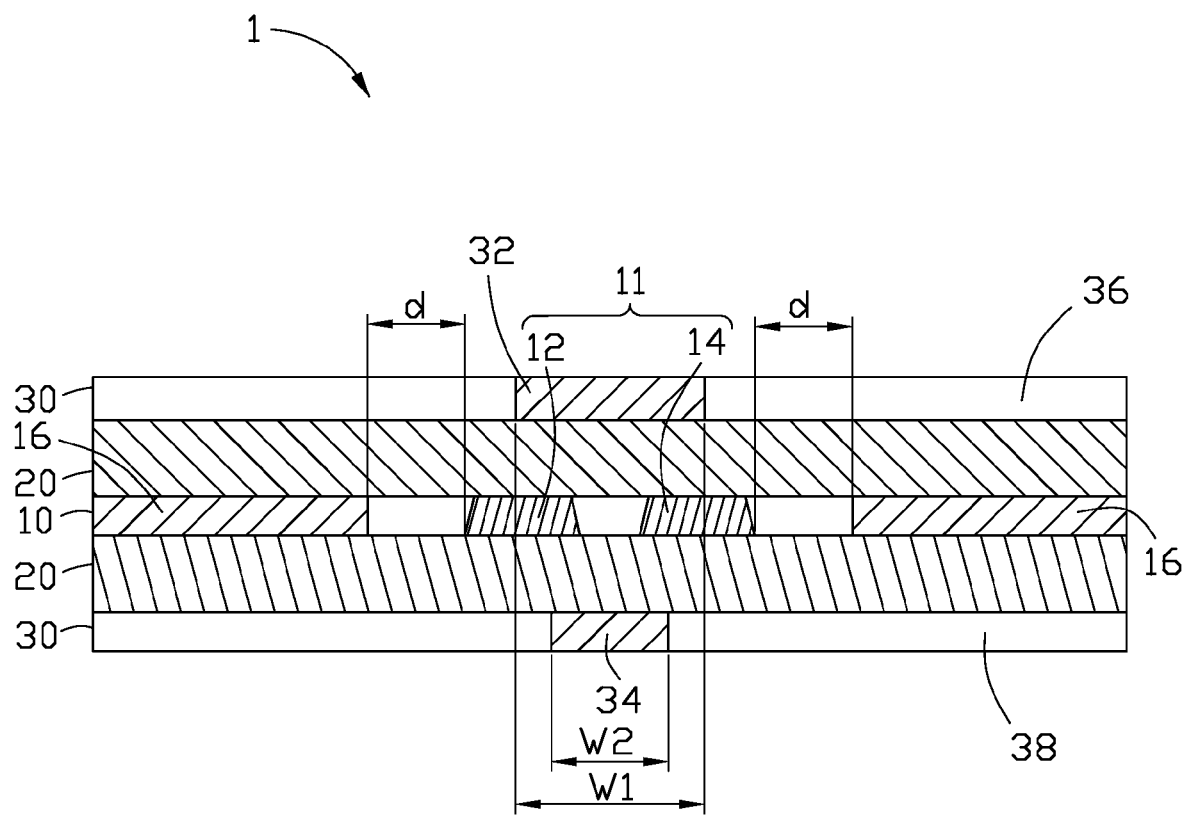
FIG. 2 is a cross-sectional view of an exemplary embodiment of an FPCB.

Referring to FIG. 2, an exemplary embodiment of a flexible printed circuit board (FPCB) 1 includes a signal layer 10, two dielectric layers 20 located on and under the signal layer 10 to sandwich the signal layer 10, and two ground layers 30 attached to the dielectric layers 20 and opposite to the signal layer 10 respectively. A differential pair 11 comprising two transmission lines 12, 14 is arranged in the signal layer 10, to transmit a pair of differential signals. In one embodiment, dielectric coefficients of the two dielectric layers 20 are different. In other embodiments, the dielectric coefficients of the two dielectric layers 20 can be same.

Two grounded sheets 16 made of conductive material, such as copper, are arranged in the signal layer 10, at opposite sides of the differential pair 11 and parallel to the differential pair 11, coupled to ground. Each grounded sheet 16 has a distance d from the differential pair 11. In one embodiment, the length of each grounded sheet 16 is equal to the length of the differential pair 11.

A grounded sheet 32 made of conductive material, such as copper, as a part of the upper ground layer 30 is arranged over the differential pair 11 and along a transmitting direction of the differential pair 11. Two voids 36 are defined in an upper ground layer 30 of the two ground layers 30, at opposite sides of the grounded sheet 32. In one embodiment, the distances between a middle line of the grounded sheet 32 and middle lines of the two transmission lines 12 and 14 are equal. The length of the grounded sheet 32 is equal to the length of the differential pair 11. The width W1 of the grounded sheet 32 is less than the maximal width of the differential pair 11.

A grounded sheet 34 made of conductive material, such as copper, as a part of the lower ground layer 30 is arranged under the differential pair 11 and along the transmitting direction of the differential pair 11. Two voids 38 are defined in a lower ground layer 30 of the two ground layers 30, at opposite sides of the grounded sheet 34. In one embodiment, the distances between the middle line of the grounded sheet 34 and the middle lines of the two transmission lines 12 and 14 are equal. The length of the grounded sheet 34 is equal to the length of the differential pair 11. The width W2 of the grounded sheet 34 is less than the maximal width of the differential pair 11. When the dielectric coefficients of the two dielectric layers 20 are different, the width W1 of the grounded sheet 32 and the width W2 of the grounded sheet 34 are different. When the dielectric coefficients are the same and thicknesses of the two dielectric layers 20 are the same, the width W1 of the grounded sheet 32 and the width W2 of the grounded sheet 34 are the same.

The distance d, the width W1, and the width W2 are obtained by simulating the FPCB 1 of FIG. 2 using a simulation software, simulating the type of the signal to be transmitted through the transmission lines 12 and 14 and the desired impedance of the transmission lines 12 and 14, and adjusting the distance d, the width W1, and the width W2 until desired characteristic impedances of the transmission lines 12 and 14 are achieved. The distance d, the width W1, and the width W2 are also affected by the following factors: the width of each of the transmission line 12, 14; a distance between the transmission lines 12 and 14; the thicknesses of the two dielectric layers 20; and the dielectric coefficients of the dielectric layer 20.

The layout of the upper ground layer 30 over the transmission line 12 and the layout of the upper ground layer 30 over the transmission line 14 are the same; and the layout of the lower ground layer 30 under the transmission line 12 and the layout of the lower ground layer 30 under the transmission line 14 are the same, therefore the noise caused by the grid array construction of the ground layer is reduced, and the impedances of the transmission lines 12 and 14 are matched. As a result, the FPCB 1 can transmit high speed signals with little noise.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A flexible printed circuit board (FPCB), comprising:
   a signal layer comprising a differential pair, and two grounded sheets made of a conductive material arranged in the signal layer, the two grounded sheets being located at two opposite sides of the differential pair respectively, the differential pair comprising two transmission lines, wherein the transmission lines are capable of transmitting a pair of differential signals, and wherein a length of each of the two grounded sheets in the signal layer is equal to a length of the differential pair;

two dielectric layers located on and under the signal layer respectively, to sandwich the signal layer; and an upper ground layer and a lower ground layer, wherein the upper ground layer is attached to the dielectric layer located on the signal layer, opposite to the signal layer; wherein the lower ground layer is attached to the dielectric layer located under the signal layer, opposite to the signal layer, wherein each of the upper and lower ground layers comprises a grounded sheet made of a conductive material, two voids are defined in each of the upper and lower ground layers and located at opposite sides of the grounded sheet of each of the upper and lower ground layers, wherein distances between a middle line of the grounded sheet of the upper ground layer and middle lines of the two transmission lines are equal, and distances between a middle line of the grounded sheet of the lower ground layer and the middle lines of the two transmission lines are equal, wherein a width of the grounded sheet in the upper ground layer and a width of the grounded sheet in the lower ground layer are different, in response to dielectric coefficients of the two dielectric layers being different.

2. The FPCB of claim 1, wherein each grounded sheet in the signal layer has a distance from that of the differential pair.

3. The FPCB of claim 1, wherein the conductive material of the two grounded sheets in the signal layer are copper.

4. The FPCB of claim 1, wherein the conductive material of the two grounded sheets in the two ground layers are copper.

5. The FPCB of claim 1, wherein a length of each of the two grounded sheets in the upper and lower ground layers is equal to that of the differential pair.

6. The FPCB of claim 1, wherein the width of the grounded sheet in the upper ground layer and the width of the grounded sheet in the lower ground layer are both less than a maximal width of the differential pair.

7. A flexible printed circuit board (FPCB), comprising:

a signal layer comprising a differential pair, the differential pair comprising two transmission lines, wherein the transmission lines are capable of transmitting a pair of differential signals;

two dielectric layers located on and under the signal layer respectively, to sandwich the signal layer; and an upper ground layer and a lower ground layer, wherein the upper ground layer is attached to the dielectric layer located on the signal layer, opposite to the signal layer; wherein the lower ground layer is attached to the dielectric layer located under the signal layer, opposite to the signal layer, wherein each of the upper and lower ground layers comprises a grounded sheet made of a conductive material, two voids are defined in each of the upper and lower ground layers and located at opposite sides of the grounded sheet of each of the upper and lower ground layers, and wherein distances between a middle line of the grounded sheet of the upper ground layer and middle lines of the two transmission lines are equal, distances between a middle line of the grounded sheet of the lower ground layer and the middle lines of the two transmission lines are equal; and wherein a width of the grounded sheet in the upper ground layer and a width of the grounded sheet in the lower ground layer are different, in response to dielectric coefficients of the two dielectric layers being different.

8. The FPCB of claim 7, wherein two grounded sheets made of a conductive material are arranged in the signal layer, located at opposite sides of the differential pair, wherein each grounded sheet in the signal layer has a distance from that of the differential pair.

9. The FPCB of claim 8, wherein the conductive material of the two grounded sheets in the signal layer are copper.

10. The FPCB of claim 8, wherein a length of each of the two grounded sheets in the signal layer is equal to a length of the differential pair.

11. The FPCB of claim 7, wherein the conductive material of the two grounded sheets in the two ground layers are copper.

12. The FPCB of claim 7, wherein a length of each of the two grounded sheets in the upper and lower ground layers is equal to that of the differential pair.

13. The FPCB of claim 7, wherein the width of the grounded sheet in the upper ground layer and the width of the grounded sheet in the lower ground layer are both less than a maximal width of the differential pair.

* * * * *